United States Patent [19]

Masuda

[11] 4,069,427
[45] Jan. 17, 1978

[54] MIS LOGIC CIRCUIT OF RATIOLESS TYPE
[75] Inventor: Kenzo Masuda, Tokorozawa, Japan
[73] Assignee: Hitachi, Ltd., Japan
[21] Appl. No.: 739,042
[22] Filed: Nov. 5, 1976
[30] Foreign Application Priority Data
Nov. 10, 1975 Japan .................. 50-134108
[51] Int. Cl.² .............. H03K 19/08; H03K 19/20; G11C 19/00
[52] U.S. Cl. ................ 307/205; 307/200 B; 307/213; 307/215; 307/221 C; 365/104; 365/185; 365/203
[58] Field of Search ............ 307/200 B, 205, 207, 307/213, 214, 215, 221 C, 224 C, 223 C; 328/162, 163; 340/173 SP

[56] References Cited
U.S. PATENT DOCUMENTS

| | | | |
|---|---|---|---|
| 3,518,451 | 6/1970 | Booher | 307/221 C |
| 3,541,543 | 11/1970 | Crawford et al. | 307/205 X |
| 3,678,476 | 7/1972 | Ebertin | 307/205 X |
| 3,702,945 | 11/1972 | Faith et al. | 307/221 C X |
| 3,909,674 | 9/1975 | Spence | 307/200 B X |
| 3,991,326 | 11/1976 | Kawagoe et al. | 307/205 X |
| 3,999,081 | 12/1976 | Nakajima | 307/205 |
| 4,021,781 | 5/1977 | Caudel | 340/173 SP X |

Primary Examiner—John S. Heyman
Assistant Examiner—Larry N. Anagnos
Attorney, Agent, or Firm—Craig & Antonelli

[57] ABSTRACT

An MIS logic circuit of a ratioless type comprising at least one logic section including one or more MIS FETs and provided with first and second electric energy suppressors which otherwise is fed back from output to input of the logic block through the gate-to-source capacitance and the gate-to-drain capacitance of the MIS FET. The first and second suppressors are connected with the drain and the source of the MIS FET respectively so that they are in series connection.

9 Claims, 13 Drawing Figures

MIS LOGIC CIRCUIT OF RATIOLESS TYPE

The present invention relates to an MIS (metal insulator semiconductor) logic circuit using insulated-gate field-effect transistors (hereinafter referred to as MIS FET) and more particularly to a multi-phase MIS logic circuit of a ratioless type.

A mask ROM (mask programmable read only memory) is a memory device for storing information as a fixed memory. Information needed by any particular user is permanently written in such an ROM at the time of its manufacture by a maker. The ROMs may be classified into MIS type ROMs and bipolar type ROMs according to their structure.

In an MIS ROM having a matrix, the thicknesses of the oxide films for insulating the gates of MIS FETs located at the cross points in the matrix are different according to the pattern of information to be stored. The MIS FETs having thin oxide films also have low threshold voltages and can be turned on and off depending upon the operating voltage, but those having thick oxide films always remain in off state.

In copending patent applications Ser. No. 611,891 filed Sept. 10, 1975 and Ser. No. 634,772 filed Nov. 24, 1975, and assigned to the assignee of the present invention is proposed an MIS logic circuit including a combination of depletion mode MIS FETs and enhancement mode MIS FETs which circuit is susceptible of a geometrical matrix layout at a high density. In this MIS logic circuit, a logic circuit unit includes a series connection of enhancement mode MIS FETs and depletion mode MIS FETs wherein the enhancement mode FETs are turned on and off depending upon the operating voltage while the depletion mode MIS FETs always remain in on state. With this structure, there is obtained an MIS logic circuit formed in a single semiconductor substrate at a very high integration density. Further, since the MIS logic circuit can be simply and easily fabricated its reliability and fabrication yield are much improved. More particularly, with this structure in which enhancement mode FETs and depletion mode FETs are arranged in matrix, aluminum wiring layers for multi-layer wiring can be eliminated and moreover such multi-layer wiring configuration is unnecessary even at the cross points of the source or drain regions and conductor layers such as polycrystal silicon layers serving as gate electrodes. Furthermore, in the above-mentioned MIS logic circuit since the drain regions of the FETs are also used as the source regions of the adjacent FETs, there is no need of connection of the drains with the ground line or with the aluminum layer through contact holes for multilayer wiring required in the conventional MIS logic circuit layout.

However, the present inventor has found that if such an MIS logic circuit as having the above-described structure is adapted for the ratioless type drive system to decrease its power consumption, the following problem is presented.

Namely, the so-called gate capacitance having a rather large value exists between the gate as an input terminal and the source or the drain as an output terminal of the depletion mode FET. The pre-charge signal on the output side (on the digit line) is fed back to the input side through the gate capacitance and affects the level of the input signal in the floating state so that an erroneous operation is caused.

It is therefore one object of the present invention to provide an MIS logic circuit of a ratioless type in which the influence of the pre-charge voltage upon the floating level of the input is suppressed.

Another object of the present invention is to provide an MIS logic circuit of a ratioless type incorporating therein a circuit for preventing an erroneous operation, having a simple structure.

In one aspect of the present invention, the MIS logic circuit of a ratioless type is so designed as to provide both the ends of the logic section or block having an MIS FET with means for suppressing feedback of electric energy from output to input side of the logic block and therefore to reduce the variations of the voltage on the source or the drain of the MIS FET.

Other objects and features of the present invention will become apparent from the following description of the preferred embodiments of the invention along with the attached drawings, in which:

FIGS. 4b and 4c show the circuit structure of the inverters used in the translator circuit shown in FIG. 4a;

FIG. 5a shows a part of the translator circuit in FIG. 4a;

FIG. 6 shows waveforms of clock signals for timing used in FIGS. 4a and 5a;

For a better understanding of the present invention, reference will first be made to the problems encountered with the circuit disclosed in the above-mentioned copending U.S. Ser. No. 611,891 and U.S. Ser. No. 634,772, with the aid of FIGS. 1 to 3.

Figure 1:
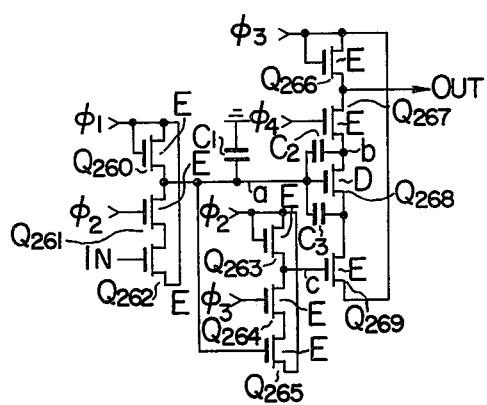
FIG. 1 shows an example of a ratioless type logic circuit.
Figure 2:
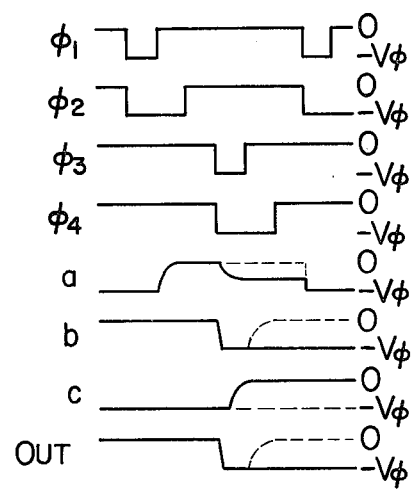
FIG. 2 shows waveforms useful in explaining the operation of the circuit shown in FIG. 1.

As shown in FIG. 1, a logic block constituting a part of an ROM includes a P-channel depletion mode FET $Q_{268}$ and a P-channel enhancement mode FET $Q_{269}$ which are arranged to receive signals in opposite phase. (The depletion and enhancement modes are represented by "D" and "E", respectively, in the drawings.) Namely, a signal $a$ produced according to timing pulses $\phi_1$ and $\phi_2$ by a first inverter including P-channel enhancement mode FETs $Q_{260}$–$Q_{262}$ is applied to the FET $Q_{268}$ while a signal $c$ produced according to timing pulses $\phi_2$ and $\phi_3$ by a second inverter including P-channel enhancement mode FETs $Q_{263}$–$Q_{265}$ is applied to the FET $Q_{269}$. If an input signal IN is at a low level (low enough to make the transistor $Q_{262}$ conductive or ON) under the above conditions, the output $a$ of the first inverter, i.e. a first input signal to the ROM is made to assume a high level (0 volt) in the floating state according to the timing pulse $\phi_2$. This first input signal $a$ is, in principle, supposed to remain at the high level, as indicated by the dotted line. Meanwhile, the second inverter for producing the inverted version of the signal $a$ is precharged by the timing pulse $\phi_2$ and ought to deliver an inverted signal or a second input signal $c$ according to the timing pulse $\phi_3$, as indicated by the dotted line. Actually, however, at the time when a timing pulse $\phi_3$ is applied as shown, not only the logic block ($Q_{267}$–$Q_{269}$) is pre-charged but also the input load capacitance $C_1$ is charged through the gate capacitances ($C_2$ and $C_3$) of the FET $Q_{268}$ with a result that the first and second input signals $a$ and $c$ change as illustrated by the solid lines rather than by the dotted lines. If, for example, $C_1 = C_2 + C_3$, the voltage to which the capacitance $C_1$ is charged will be $\frac{1}{2}$ V$\phi$ (V$\phi$ : the pre-charging voltage), so that the first input signal $a$ is driven to a low level ($\frac{1}{2}$ V$\phi$ volts). If the absolute value of this first input signal $a$ is greater than the threshold voltage value of the FET $Q_{265}$, the latter is rendered ON to make its output signal $c$ to the high level as illustrated by the solid line. Therefore, for the input signal IN at the low level ($-$V$\phi$ volts), the output signal OUT assumes the low level, which causes an erroneous operation.

Figure 3:
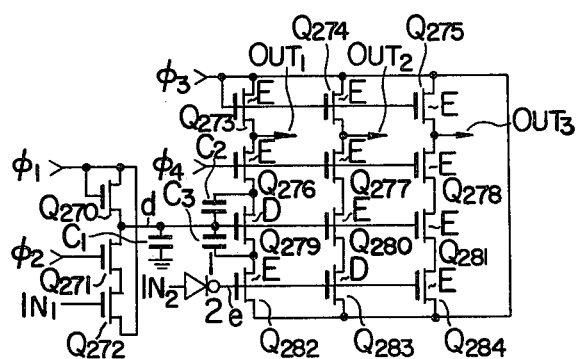
FIG. 3 shows another example of a ratioless type logic circuit.

In an ROM constituting a decoder circuit shown in FIG. 3, when the output signal $d$ of an inverter ($Q_{270}$–$Q_{272}$) for application as an input to the decoder is at a high level (0 volt), the pre-charge voltage according to the timing pulse $\phi_3$ drives the signal $d$ at the high level in the floating state to the low level ($-$V$\phi$ volts) through the gate capacitances $C_2$ and $C_3$ of a depletion mode FET $Q_{279}$. Since this signal $d$ falsely at the low level is also applied to other FETs $Q_{280}$ and $Q_{281}$ constituting a matrix, they are undesirably rendered ON as they are in enhancement mode as shown, although the signal $d$ should have been such as to render them non-conductive or OFF. And, since the FETs $Q_{283}$ and $Q_{284}$ in the logic block including the FETs $Q_{280}$ and in the logic block including the FET $Q_{281}$ are in depletion mode and in enhancement mode respectively as shown, if the input signal $e$ renders the FET $Q_{284}$ ON, the decoder output signals $OUT_2$ and $OUT_3$ responsive to the input signals $d$ and $e$ are falsely at high levels.

The above problem of erroneous operation is incidental not only to a depletion mode FET but also to an enhancement mode FET having an Al gate, though the resulting adverse effects may be different, since the overlap capacitance between gate and source or between gate and drain is relatively large.

Now, the present invention will be described in detail by way of embodiment with the aid of the attached drawings.

Figure 4A:
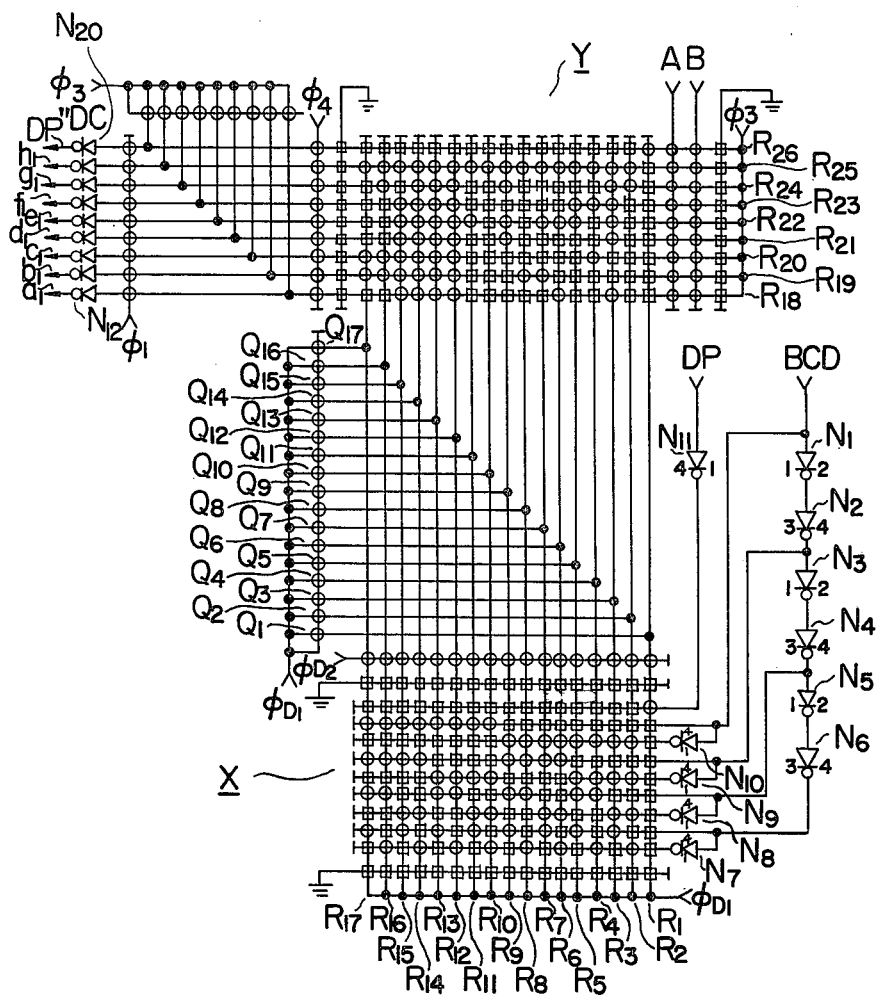
FIG. 4a shows a schematic structure of a translator circuit as one embodiment of the present invention.
Figure 4B:
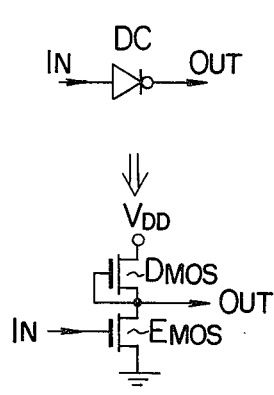
Figure 4C:
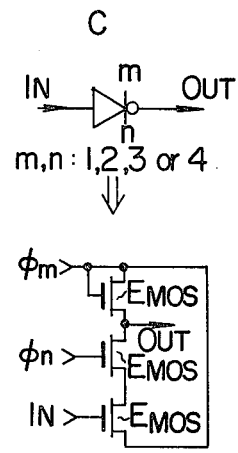

FIG. 4$a$ shows an embodiment of the present invention as applied to a four-phase code translator circuit of a ratioless type which may be incorporated in an electronic computer, for translating a BCD (binary coded decimal) code signal into a code signal for selecting segments of display elements.

In FIG. 4$a$, an ROM matrix circuit X comprising logic blocks $R_1$ – $R_{17}$ serves to translate a BCD code signal into a decimal code signal and an ROM matrix circuit Y comprising logic blocks $R_{18}$ – $R_{26}$ serves to translate a decimal code signal into a code signal for selecting segment of display elements. At those cross points or intersections in the ROM matrix circuits X and Y which are marked with a white circle O, are located enhancement mode FETs each having a gate insulating film with a thickness of about 800 – 1200 A while at the intersections marked with a square □ are located depletion mode FETs each having a gate insulating film with the same thickness.

Figure 6:
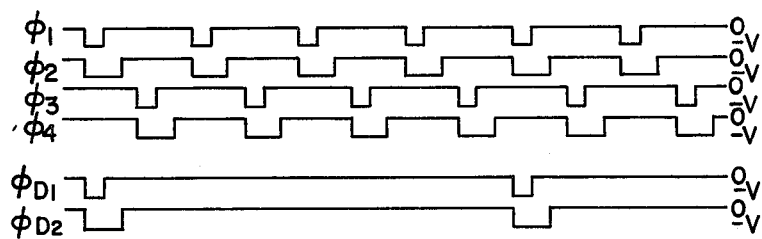

A serial BCD code signal is applied to a shift register comprising inverters $N_1$ – $N_6$ having a circuit construction shown in FIG. 4$c$ and is thereby converted to a parallel BCD code signal. Timing signals $\phi_1$ – $\phi_4$ for the shift register are, along with a precharge timing signal $\phi_{D1}$ and an output timing signal $\phi_{D2}$, shown in FIG. 6. Namely, by using the pre-charge timing signal $\phi_{D1}$ and the output timing signal $\phi_{D2}$ of the ROM X as digit pulse signals synchronized respectively with the clock timing signals $\phi_1$ and $\phi_2$, as shown in FIG. 6, the ROM X delivers, upon receipt of a parallel BCD code signal, a decimal code signal. A signal DP, being a decimal point signal, is also applied through the ROM X to the ROM Y for generating a segment selection decimal point signal.

The decimal point signal and the decimal code signal obtained from the logic blocks $R_1$ – $R_{17}$ are applied as inputs to the ROM Y, which in turn delivers a segment selection signals corresponding to the inputs thereto. Inverters $N_{12}$ – $N_{20}$ are in the form of a ratio type having a circuit construction shown in FIG. 4$b$ and serve to deliver segment selection output signal portions $a_1$, $b_1$, $c_1$, . . ., $h_1$, DP" to segments of display elements or to a circuit for driving them in accordance with the output of the ROM Y. Signals A and B applied to the ROM Y serve to inhibit the display output during operation of the ROMs X and Y and during the time for which display is needless.

In the circuit shown in FIG. 4$a$, in order to prevent an erroneous operation, depletion mode FETs with their gates grounded are provided at both the ends of the ROM X and ROM Y each constituting a logic block. This configuration will be evident from FIG. 5$a$ concretely showing the ROM X for translating a BCD code signal into a decimal code signal.

In FIG. 5$a$, the letters E and D attached to FETs $Q_1$ – $Q_{221}$ respectively indicate that they are in enhancement mode and depletion mode, respectively. When the decimal point signal DP is applied to the ROM X, the enhancement mode FET $Q_{52}$ in the logic block $R_1$ is turned on so that, since the other FETs indicated below the FET $Q_{52}$ in the logic block $R_1$ are in depletion mode, an output DP' being at a high level (ground level) is obtained from the logic block $R_1$. When the BCD signal portions having weights "1", "2", "4" and "8" at the input terminals are all "0" (i.e. at the high level), the enhancement mode FETs $Q_{87}$, $Q_{121}$, $Q_{155}$ and $Q_{189}$ are turned on so that, since the adjacent FETs are in depletion mode, a decimal code signal portion "0" is obtained from the logic block $R_2$. In a similar manner, other BCD code signal portions are translated into the corresponding decimal code signal portions.

It should be noted that depletion mode FETs $Q_{35}$ – $Q_{51}$ and $Q_{205}$ – $Q_{221}$ are provided at both the ends of the respective logic blocks $R_1$ – $R_{17}$, with the gates of these depletion mode FETs grounded.

The principle of operation of the ROM X will now be described, taking the logic block $R_2$ as a typical example among the logic blocks constituting the ROM X.

While the pre-charge timing signal $\phi_{D1}$ is at a low level ($-$V volts) the FET $Q_2$ is turned on to pre-charge an output capacitance $C_7$ to, for example, $-6$ to $-15$ volts. By the output timing signal $\phi_{D2}$ the logical state of the logic block $R_2$ is "inspected" to deliver an output signal portion according to the voltage on the output point $J_0$, which is determined by the conduction state of the enhancement mode FETs $Q_{87}$, $Q_{121}$, $Q_{155}$ and $Q_{189}$. Namely, if these enhancement mode FETs are all conductive or ON with their gates supplied with low level (ON-level) signals ($-V$ volts), the pre-charged output capacitance is discharged through the series-connected FETs $Q_{19}$, $Q_{36}$, $Q_{53}$ ... $Q_{206}$ with a result that the voltage on the point $J_0$ is eventually at a high level (e.g., 0 volt). On the contrary, if at least one of the above-mentioned enhancement mode FETs is non-conductive or OFF with their gates supplied with high level (OFF-level) signals (0 volt), the logic block $R_2$ is as a whole non-conductive with a result that the pre-charged voltage on the output capacitance $C_7$ is maintained and the voltage on the point $J_0$ is at a low level. Then, the output from the output point $J_0$ is fed to the ROM Y shown in FIG. 4a and controlled by the timing signals $\phi_3$ and $\phi_4$ shown in FIG. 6.

Figure 5A:
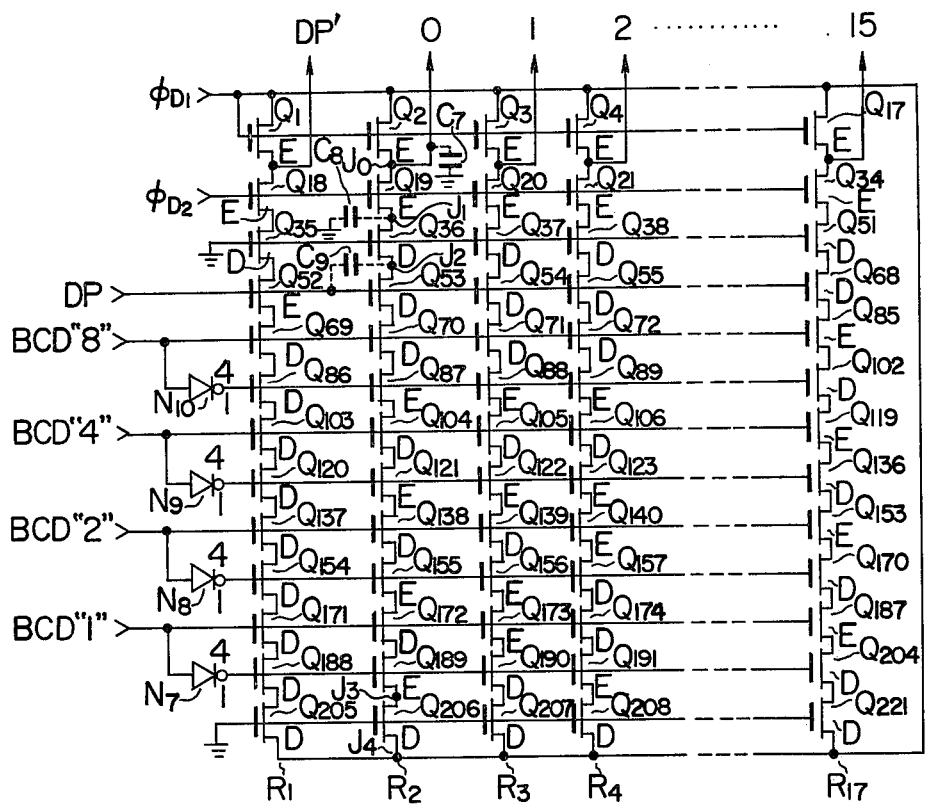

As can be seen from FIG. 5a, the logic block $R_2$ includes depletion mode MIS FETs $Q_{36}$ and $Q_{206}$ at its both ends $J_1$ and $J_2$; the FET $Q_{36}$ being connected between the enhancement mode FET $Q_{19}$ arranged for receiving the output timing signal $\phi_{D2}$ and the depletion mode FET $Q_{53}$ arranged for receiving the decimal point signal portion DP, and the FET $Q_{206}$ being connected with the enhancement mode FET $Q_{189}$. Since the depletion mode MIS FETs $Q_{36}$ and $Q_{206}$ have a small threshold voltage $V_{thD}$, the voltages on points $J_2$ and $J_3$ at which they are connected are restricted or clamped to the threshold voltage. For example, if the threshold voltage $V_{thD}$ is $+$ 3 volts, the voltage on the points $J_2$ and $J_3$ become $-$ 3 volts. This is because the source voltage $V_S$ of an MIS FET is determined by $V_S = V_G - V_{th}$, where $V_G$ and $V_{th}$ represent the gate voltage and the threshold voltage, respectively. More particularly, as the clamping FETs $Q_{36}$ and $Q_{206}$ have their gates grounded, their gate voltages are both 0 volt ($V_G = 0$); and as they are in depletion mode, their threshold voltages are $+$ $V_{thD}$. Thus, the source voltage of the FET $Q_{36}$, i.e., the voltage on the point $J_2$ being the gate voltage minus the threshold voltage will be $0 - (+ V_{thD}) = -V_{thD}$. Accordingly, by making the absolute values of the threshold voltages of the FETs $Q_{36}$ and $Q_{206}$ small it is possible to clamp the voltages on the points $J_2$ and $J_3$ to such threshold voltages. In this way, the voltage appearing on the output point $J_0$ as a result of charging the capacitor $C_7$ hence the voltage information on the point $J_1$ can be prevented from being fed back to, for example, the switching FET $Q_{52}$ in the next preceding logic block $R_1$. Similarly, the pre-charge timing signal $\phi_{D1}$ being applied to the point $J_4$, the voltage on the point $J_3$ can be restricted by the FET $Q_{206}$ to a low voltage determined by the FET $Q_{206}$ so that any leakage or feedback due to the signal $\phi_{D1}$ to a preceding logic block can be prevented.

As described above, by connecting the depletion mode MIS FETs with the ends of each logic block and by grounding the gates of the FETs, the potential at the sources (the logic block side electrodes) of the FETs never exceeds the threshold voltages (e.g., about $-$ 3V) of the depletion mode FETs irrespective of the pre-charge voltage (e.g., $-6$V to $-15$V) so that the adverse effect onto the input side or a preceding logic block (stage) in the floating state is made small, whereby an erroneous operation can be prevented.

In other words, in a logic circuit comprising one or more logic blocks each including an FET to which an input signal is applied and means for pre-charging the logic blocks, depletion mode MIS FETs are provided at both the ends of each logic block, e.g., between the logic block and the pre-charge means, with their gates grounded for suppressing adverse effect of the pre-charging to considerably restrict the voltage applied to the logic block with a result that adverse effect or influence of the output side onto the input side in the floating state can be lessened.

The degree of the influence upon the input side in the floating state is determined by the ratio between the gate-to-ground capacitance and the capacitances existent between the gate and the two ends of the logic block and therefore if the gate-to-ground capacitance is made sufficiently larger than the gate capacitances existent between the gate and the two ends of the logic block, the influence may be eliminated. However, this requires a large area for the large gate-to-ground capacitance and a longer charge-discharge time to lower the speed of operation. On the contrary, according to the circuit as an embodiment of the present invention, it is only necessary for the depletion mode FETs to be connected with each logic block so that the constitution is simplified, without sacrificing the density of integration nor the speed of operation.

Figure 5C:
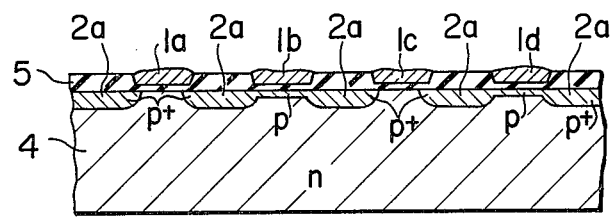
FIG. 5c is a cross section taken along line VC—VC in FIG. 5b.
Figure 5B:
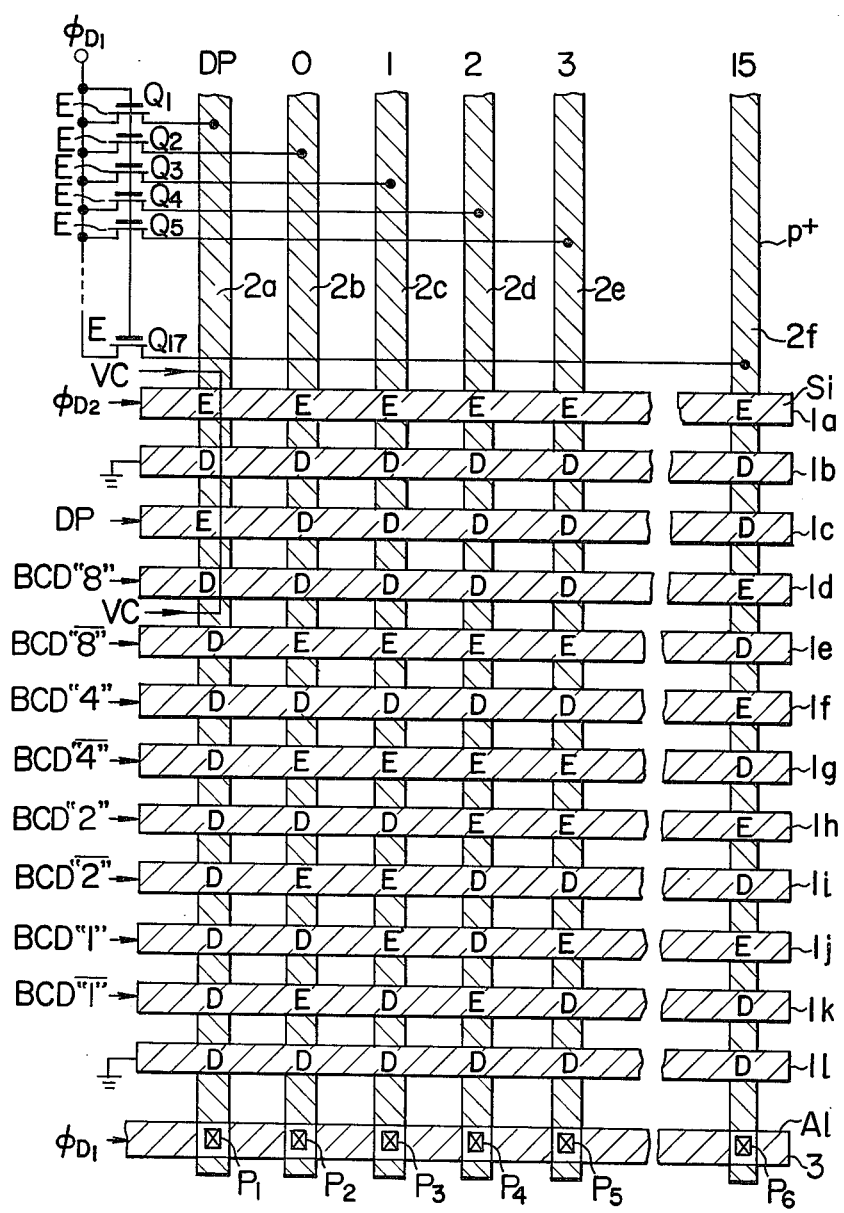
FIG. 5b shows a pattern including slender gate conductor layers and slender doped regions and corresponding to FIG. 5a circuit.

FIG. 5b shows a pattern of an integrated circuit equivalent to the circuit shown in FIG. 5a. In FIG. 5b, input gate lines 1a - 1l are formed of conductive polycrystal silicon and source and drain lines 2a - 2f are formed of P+ type semiconductor regions through diffusion with the input gate lines used as a mask. The gate lines 1a - 1l are substantially parallel with each other and the source and drain lines 2a - 2f are substantially perpendicular to the gate lines 1a - 1l. In accordance with information to be stored, a P-type impurity is introduced by, for example, ion implantation into predetermined channel regions under the input gate lines 1a - 1l so as to form depletion mode FETs.

In the ROM matrix so fabricated as described above, the gate lines 1c - 1k constituting the logic blocks, to which input information signals DP, BCD"8" - BCD"1" are applied, are disposed between the gate lines 1b and 1l under which only depletion mode FETs are formed and the gate lines 1b and 1l are connected with a reference potential source, e.g., are grounded. The gate line 1a is used to form FETs for reading the information as outputs. To pre-charge the logic blocks, the pre-charge voltage is applied thereto through the reading FETs with the gate line 1a used as their common gate. It is therefore preferable to dispose the FETs for limiting the pre-charge voltage, i.e. gate line 1b, closer to the logic blocks than the gate line 1a, as shown in FIG. 5b.

A wiring layer 3 of aluminum (Al) almost parallel with the gate lines 1a - 1l connects in common the source and drain lines 2a - 2f by means of contacts $P_1$ - $P_6$ for the purpose of applying the pre-charge timing signal $\phi_{D1}$.

FIG. 5c is a cross section taken along line VC — VC in FIG. 5b. In FIG. 5c, reference characters 1a - 1d indicate such gate lines as described above, 2a the source and gate lines of the FETs, 4 a semiconductor substrate and 5 a $SiO_2$ film.

The present invention is not limited to the embodiments described above, but permits of other various alteration and modification.

Figure 7:
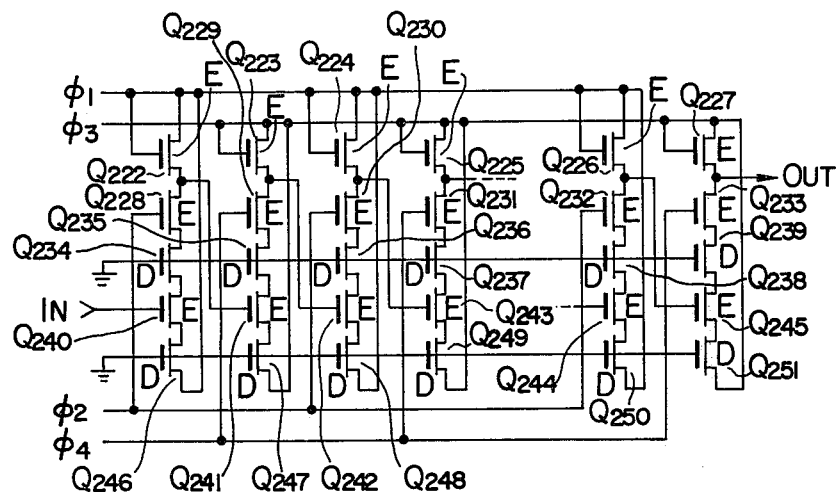
FIG. 7 shows the circuit of a shift register as another embodiment of the present invention.

The present invention can be applied not only to the above described ROM of serial type, comprising a combination of enhancement mode and depletion mode FETs, but also to an ordinary four-phase MIS logic circuit of a ratioless type such as, for example, a shift register shown in FIG. 7. Especially in case where enhancement mode FETs having Al gate electrodes are used, the overlap capacitance between gate and source or between gate and drain is large so that a floating state input to an enhancement mode FET is liable to be affected by the pre-charge voltage. With such a constitution, therefore, it is advantageous to incorporate therein such depletion mode FETs $Q_{234} - Q_{239}$ and $Q_{246} - Q_{251}$ with their gate electrodes grounded, thereby reducing an undesirable feedback from input to output due to the pre-charge voltage in each stage.

Figure 8:
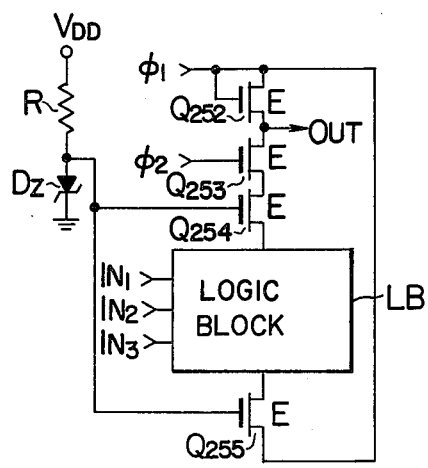
FIGS. 8 and 9 show circuits as other embodiments of the present invention.
Figure 9:
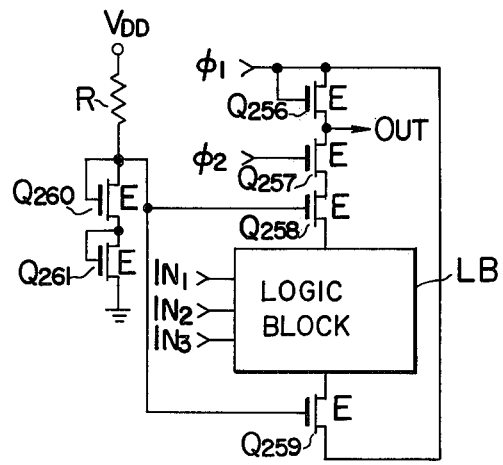

Moreover, any means may be used to decrease the voltage applied at the time of pre-charging to the sources or drains of the FETs constituting a logic block. For example, such circuits as shown in FIGS. 8 and 9 may be used, in which enhancement mode FETs are employed instead of such depletion mode FETs as employed in the above embodiments of the present invention. In such cases, it is necessary to apply a bias voltage to the gates of the enhancement mode FETs $Q_{254}$ and $Q_{255}$ or $Q_{258}$ and $Q_{259}$ through a constant voltage supply means such as a series circuit of a Zener diode $D_Z$ and a resistor R or of series-connected enhancement mode FETs $Q_{260}$ and $Q_{261}$ and a resistor R, so as to normally render the FETs $Q_{254}$ and $Q_{255}$ or $Q_{258}$ and $Q_{259}$ conductive and to make the potential values at the sources thereof small. As can be seen from FIG. 9, each of the enhancement mode FETs $Q_{260}$ and $Q_{261}$ has its gate and drain connected with each other. The bias circuit permits numerous variations. In FIGS. 8 and 9, rectangular boxes labeled LB indicate logic blocks.

The present invention can be applied to any MIS logic circuits of a ratioless type in which the input signal thereto assumes a floating state.

I claim:

1. An MIS logic circuit of a ratioless type comprising at least one logic block including input and output terminals and at least one MIS FET inherently having a gate-to-source capacitance and a gate-to-drain capacitance, the gate of said FET being connected with said input terminal, and first and second means connected with the drain and source of said FET respectively for suppressing electric energy which tends to be fed back to from said output terminal to said input terminal through said capacitances.

2. An MIS logic circuit according to claim 1, in which each of said first and second suppressing means includes a depletion mode FET having its gate grounded.

3. An MIS logic circuit according to claim 1, in which each of said first and second suppressing means includes an enhancement mode FET having its gate connected with a constant voltage supply means.

4. An MIS logic circuit according to claim 3, in which said constant voltage supply means includes a series connection of a resistor and a Zener diode.

5. An MIS logic circuit according to claim 3, in which said constant voltage supply means includes a series connection of a resistor and two series-connected enhancement mode FETs, each of said FETs in said constant voltage supply means having its gate connected with its drain.

6. A four-phase dynamic shift register comprising input and output terminals, first, second, third and fourth clock feed lines and a plurality of stages connected in tandem, each of the odd-numbered stages includes a load FET, an output FET, a first depletion mode FET, an input FET and a second depletion mode FET connected in series in the described order, the gate of said load FET being connected with said first clock feed line, the gates of said first and second depletion mode FETs being grounded, the remaining ends of said load FET and said second depletion mode FET being connected with said first clock feed line, and the gate of said output FET being connected with said second clock feed line, each of the even-numbered stages includes another load FET, another output FET, another first depletion mode FET, another input FET and another second depletion mode FET connected in series in the described order, the gate of said another load FET being connected with said third clock feed line, the gates of said other first and second depletion mode FETs being grounded, the remaining ends of said another load FET and said another second depletion mode FET being connected with said third clock feed line, and the gate of said another output FET being connected with said fourth clock feed line, and said input terminal being connected with the gate of the input FET in the first stage while said output terminal being connected with the output FET in the final stage.

7. An MIS logic circuit of a ratioless type comprising:
first and second power feed terminals;
a series circuit of first and second enhancement mode MIS FETs connected at its one end with said first power feed terminal;
at least one logic block including a plurality of series-connected MIS FETs, at least one of said plurality of series-connected MIS FETs being in enhancement mode and at least one of them being in depletion mode;
a first clamping depletion mode MIS FET interconnecting the other end of said series circuit of said first and second enhancement mode MIS FETs and one end of said logic block and a second clamping depletion mode interconnecting the other end of said logic block and said second power feed terminal;
means for applying first and second clock pulse signals to said first and second enhancement mode MIS FETs, respectively, for their switching operation;
information signal input terminals connected with the gate of said plurality of series-connected MIS FETs in said logic block;
means for connecting the gates of said first and second clamping depletion mode MIS FETs; and
means for deriving an output of said logic block from the junction between said first and second enhancement mode MIS FETs in said series circuit.

8. An MIS logic circuit according to claim 7, in which said first and second power feed terminals are connected with one of said means for applying said first and second clock pulse signals.

9. An MIS logic circuit of a ratioless type comprising:
first and second clock pulse signal feed conductors arranged substantially in parallel with each other;
a plurality of information signal feed conductors arranged substantially in parallel with said first and second clock pulse signal feed conductors;
first and second reference potential feed conductors arranged substantially in parallel with said clock pulse signal feed conductors and with said information signal feed conductors, said first reference potential feed conductor being disposed between said first clock pulse signal feed conductor and said information signal feed conductors, and said second reference potential feed conductor being disposed between said information signal feed conductors and the second clock pulse signal feed conductor; and a plurality of logic stages each including a plurality of MIS FETs connected in series with each other and arranged substantially perpendicular to said pulse signal feed conductors and to said information signal feed conductors, those of said MIS FETs which are connected with said clock pulse signal feed conductors being in enhancement mode, those of said MIS FETs which are connected with said reference potential feed conductors being in depletion mode, at least one of those of said MIS FETs which are connected with said information signal feed conductors being in enhancement mode.

* * * * *